(12) United States Patent
Miyajima et al.

(10) Patent No.: US 7,764,432 B2
(45) Date of Patent: Jul. 27, 2010

(54) LASER EQUIPMENT

(75) Inventors: Hirofumi Miyajima, Hamamatsu (JP);
Hirofumi Kan, Hamamatsu (JP);
Takayuki Uchiyama, Hamamatsu (JP);
Masaaki Matsuura, Hamamatsu (JP);
Toshimasa Matsuno, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 255 days.

(21) Appl. No.: 11/922,230

(22) PCT Filed: Apr. 27, 2006

(86) PCT No.: PCT/JP2006/308846
§ 371 (c)(1),
(2), (4) Date: Dec. 14, 2007

(87) PCT Pub. No.: WO2006/134729
PCT Pub. Date: Dec. 21, 2006

(65) Prior Publication Data
US 2009/0323193 A1    Dec. 31, 2009

(30) Foreign Application Priority Data
Jun. 15, 2005    (JP)  ................. P2005-175388

(51) Int. Cl.
*G02B 27/14*   (2006.01)
*G02B 27/10*   (2006.01)

(52) U.S. Cl. .................. 359/636; 359/618
(58) Field of Classification Search ........ 359/618, 359/629, 636, 639
See application file for complete search history.

(56) References Cited

U.S. PATENT DOCUMENTS 7,167,312 B2 *   1/2007   Voss et al. .............. 359/618

FOREIGN PATENT DOCUMENTS

| JP | 56-55518 | 5/1981 |
| JP | 7-22685 | 1/1995 |
| JP | 8-224679 | 9/1996 |
| JP | 8-309574 | 11/1996 |
| JP | 2001-284732 | 10/2001 |
| JP | 2002-335035 | 11/2002 |

* cited by examiner

*Primary Examiner*—William C Choi
(74) *Attorney, Agent, or Firm*—Drinker Biddle & Reath LLP

(57) ABSTRACT

A laser apparatus (10) has a plurality of light sources (11a to 11c) that include laser array stacks (12a to 12c). Laser beams (32b, 32c) are respectively deflected by a slit mirror (14) and a polarizing beam splitter (16) and synthesized with other laser beams (32a). These laser beams have optical axes that are inclined with respect to each other and slow axis directions that are mutually parallel. A converging optical system (20) converges the laser beams from the respective light sources at positions that are separated along a direction perpendicular to the slow axis directions.

5 Claims, 10 Drawing Sheets

(a)

(b)

(a)  (b)

(a)

(b)

LASER EQUIPMENT

TECHNICAL FIELD

The present invention relates to a laser apparatus, in particular, a laser apparatus that generates a laser beam with an intensity profile suitable for laser processing.

BACKGROUND ART

Processing of workpieces using a laser has been practiced from before. For example, metal processing, in particular, welding of steel plates by a laser is employed widely in many industries, such as the automobile industry. FIG. 1 shows a manner in which two steel plates 71 and 72 are laser welded. As shown in FIG. 1(a), in $CO_2$ laser welding or YAG laser welding, ends of steel plates 71 and 72 are butted against each other and a laser beam 74, having a substantially circular transverse section, is illuminated onto a butted region 73. FIG. 1(b) shows intensity profiles of the laser beam 74. If a coordinate system, having an A-axis, extending along a longitudinal direction of the butted region 73, and a B-axis, perpendicular to the A-axis, is defined, the laser beam 74 has a Gaussian intensity profile in both the A-axis direction and the B-axis direction.

As the light source for laser welding, a semiconductor laser element can be used as disclosed in Japanese Published Unexamined Patent Application No. Hei 8-309574. Normally with a laser beam that is emitted from a semiconductor laser element, because a spread angle in a fast axis direction differs from that in a slow axis direction, the laser beam has a transverse section of elongate shape. With the invention described in the abovementioned Publication, a synthesized beam with a transverse section that is close to being circular is formed by overlapping laser beams from a plurality of semiconductor laser elements with the longitudinal directions of the transverse sections of the respective beams being made to differ from each other.

Laser welding can also be performed using a laser beam of high output (no less than several hundred W) emitted from a semiconductor laser array. Because a semiconductor laser array has a plurality of light emitting portions that are aligned in a slow axis direction, a laser beam 75 from the semiconductor laser array has a rectangular transverse section as shown in FIG. 1(c). By matching a major axis direction of the laser beam 75 with the longitudinal direction of the butted region 73 and scanning the laser beam 75 in the major axis direction, welding can be performed while performing preheating and slow cooling. Because thermal strain can thereby be suppressed, a high processing quality is obtained.

FIG. 1(d) shows intensity profiles of the laser beam 75 in the major axis direction and the minor axis direction. The profile in the major axis direction of the laser beam 75 is formed by the overlapping of Gaussian profiles of laser beams emitted from the respective light emitting portions. The laser beam 75 thus has a top hat shaped profile, with a flat peak portion, in the major axis direction. Meanwhile, the profile in the minor axis direction has the same Gaussian shape as a laser beam emitted from a single light emitting portion. A laser beam having such profiles is disclosed in Japanese Published Unexamined Patent Application No. 2002-335035.

FIG. 2 is an enlarged view of the butted region 73 shown in FIG. 1. It is difficult to form the ends of the steel plates 71 and 72 into perfect straight lines and the ends are curved or deformed in many cases. Thus when the ends of two steel plates are butted against each other, a gap may form between the two. A width W of this gap is extremely non-uniform (for example, approximately 0 to 200 μm).

Because each of the abovementioned laser beams 74 and 75 has Gaussian profile along the direction that extends across the butted region 73 (B-axis direction), allowances in regard to the gap between the steel plates and the deviation of the beam illumination position are small. For example, a portion of the laser beam that is highest in intensity may become illuminated onto the gap, thereby lowering the welding efficiency and causing a processing fault. Also, because normally the illumination position of a laser beam has an error of approximately ±50 to 100 μm in the B-axis direction, even a slight deviation of the illumination position may cause the high intensity portion of the laser beam not to be illuminated onto the butted region 73 and thereby cause a processing fault.

Thus an object of the present invention is to provide a laser apparatus that generates a laser beam, with which a processing fault is unlikely to occur during laser processing.

DISCLOSURE OF THE INVENTION

The present invention provides a laser apparatus including: a first light source, having a first laser array stack, in which a plurality of first semiconductor laser arrays, each emitting a first laser beam, are laminated; a second light source, having a second laser array stack, in which a plurality of second semiconductor laser arrays, each emitting a second laser beam, are laminated; a beam synthesizing means, deflecting at least one of the first and second laser beams and generating a synthesized beam formed of the first and second laser beams; and a converging means, converging the synthesized beam. The first laser beams exiting from the beam synthesizing means have mutually parallel optical axes and mutually parallel slow axis directions. The second laser beams exiting from the beam synthesizing means have optical axes that are mutually parallel and inclined with respect to the optical axes of the first laser beams and have slow axis directions that are parallel to the slow axis directions of the first laser beams. The converging means converges the first laser beams onto a first convergence position within a plane perpendicular to the slow axis directions, and converges the second laser beams onto a second convergence position within the plane perpendicular to the slow axis directions. The second convergence position is separated by a predetermined distance from the first convergence position along a direction perpendicular to both an optical axis of the converging means and the slow axis directions.

The distance between the first and second convergence positions may be set so that the intensity profiles of the first and second laser beams, which are respectively converged onto the first and second convergence positions, overlap partially in a plane perpendicular to the slow axis directions. The intensity profiles of the first and second laser beams may, for example, have Gaussian shapes.

The laser apparatus may further include a means that adjusts an orientation of the second laser array stack so that the optical axes of the second laser beams are rotated about rotation axes parallel to the slow axis directions of the second laser beams.

The second light source may further include a beam refracting means that receives the second laser beams from the second laser array stack. The beam refracting means may refract the second laser beams so that the second laser beams that are contained in the synthesized beam have optical axes that are inclined with respect to the optical axes of the first laser beams.

The beam synthesizing means may have a transmitting portion, transmitting the first laser beams, and a reflecting portion, reflecting the second laser beams so that the slow axis directions of the first and second laser beams are made mutually parallel.

Understanding of the present invention shall be deepened by the detailed description that follows and the attached drawings. The attached drawings only illustrate examples and are not intended to restrict the scope of the present invention.

DESCRIPTION OF SYMBOLS

10 ... laser apparatus, 11a-11c ... light source, 12a-12c ... laser array stack, 14 ... slit mirror, 16 ... polarizing beam splitter, 18 ... half-wave plate, 20 ... converging optical system, 32a-32c ... laser beam, 38 ... collimating lens, 40a-40c ... goniometer stage, 41 ... pedestal, 45a-45c ... rotation axis, 52a-52c ... optical axis, 53a-53c ... fast axis, 54a-54c ... slow axis

BEST MODES FOR CARRYING OUT THE INVENTION

Embodiments of the present invention shall now be described in detail with reference to the attached drawings. In the description of the drawings, elements that are the same shall be provided with the same symbol and redundant description shall be omitted.

Basic principles of an embodiment shall first be described. In this embodiment, by converging laser beams emitted from a plurality of light sources onto different positions and overlapping the Gaussian intensity profiles of the laser beams in a mutually shifted manner, a top hat shaped intensity profile is formed.

Figure 1:
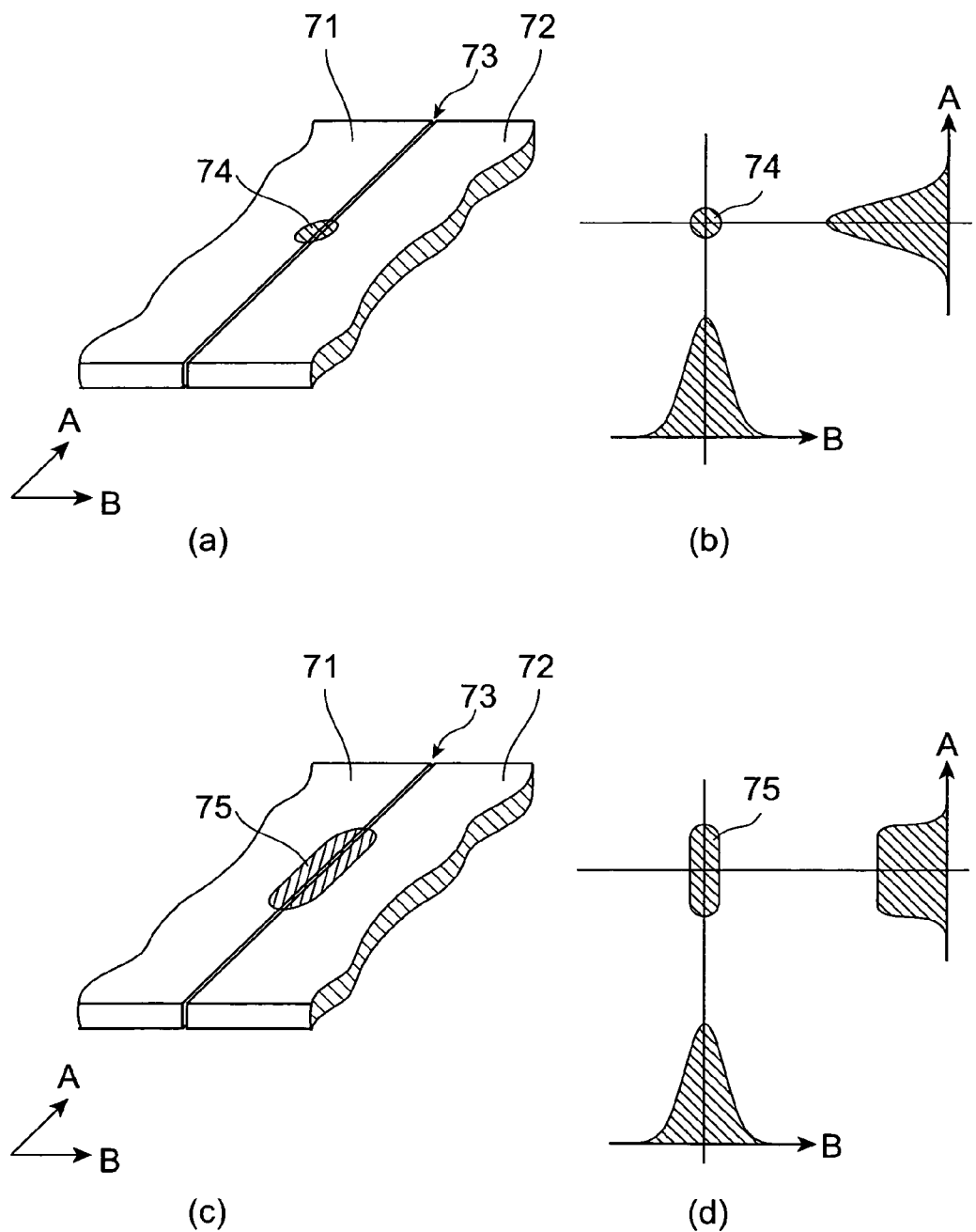
FIGS. 1(a)-(d) show diagrams of a manner in which two steel plates are laser welded.
Figure 2:
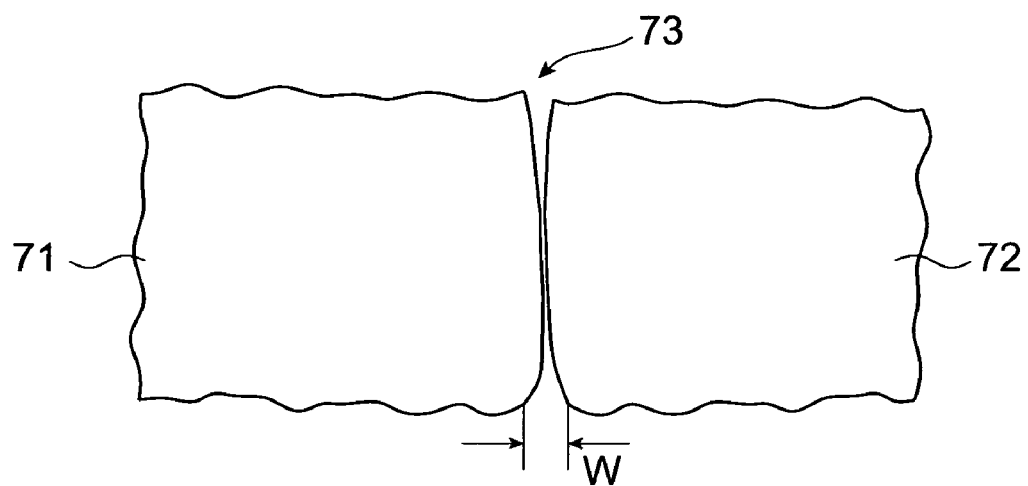
FIG. 2 is an enlarged view of a butted region of the steel plates.
Figure 3:
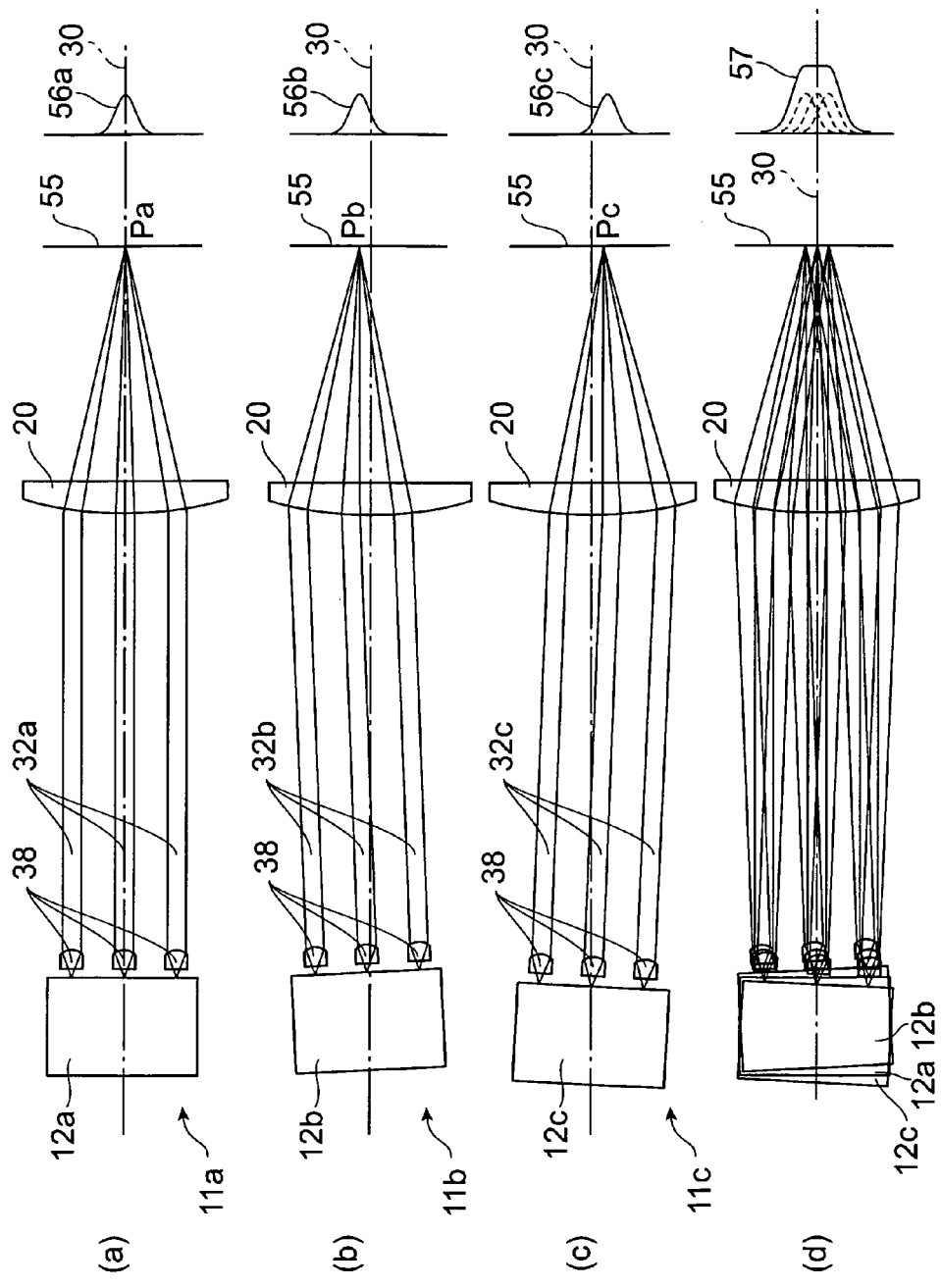
FIGS. 3(a)-(d) show schematic side views of laser beams emitted from a plurality of light sources and the overlapping of the laser beams.

FIG. 3 shows schematic side views of optical paths of laser beams 32a to 32c, emitted from three light sources 11a to 11c, respectively, and the overlapping of these laser beams. Each laser beam is generated by a semiconductor laser array, having a plurality of light emitting portions that are aligned in a direction perpendicular to the paper surface of FIG. 3. The light sources 11a to 11c include semiconductor laser array stacks 12a to 12c, each being arranged by laminating a plurality of the semiconductor laser arrays perpendicular to the direction of alignment of the light emitting portions. The laser beams 32a to 32c emitted from the laser array stacks 12a to 12c are made parallel (collimated) within a plane perpendicular to the paper surface of FIG. 3 by collimating lenses 38. The parallel laser beams 32a to 32c are converged by a converging optical system 20.

As shown in FIG. 3(a), of the laser beams 32a emitted from the first light source 11a, components that are parallel to the paper surface of FIG. 3 are converged onto a point Pa by the converging optical system 20. In the present example, because optical axes of the respective laser beams 32a are parallel to an optical axis 30 of the converging optical system 20, the focal point position Pa is a focal point of the converging optical system 20 and is thus also an intersection of a focal plane 55 of the converging optical system 20 and the optical axis 30. The converged laser beams 32a have a Gaussian intensity profile as indicated by symbol 56a.

As shown in FIG. 3(b), the laser beams 32b, emitted from the second light source 11b, are made incident on the converging optical system 20 along directions that are slightly inclined counterclockwise from the optical axis 30 of the converging optical system 20. Of the respective laser beams 32b, components that are parallel to the paper surface of FIG. 3 are converged onto a point Pb on the focal plane 55 by the converging optical system 20. The converged laser beams 32b have a Gaussian intensity profile as indicated by symbol 56b.

As shown in FIG. 3(c), the laser beams 32c, emitted from the third light source 11c, are made incident on the converging optical system 20 along directions that are slightly inclined clockwise from the optical axis 30 of the converging optical system 20. Of the respective laser beams 32c, components that are parallel to the paper surface of FIG. 3 are converged onto a point Pc on the focal plane 55 by the converging optical system 20. The converged laser beams 32c have a Gaussian intensity profile as indicated by symbol 56c.

As shown in FIG. 3(d), when the laser beams 32a to 32c are synthesized, the intensity profiles 56a to 56c overlap in a mutually shifted manner. Consequently, a top hat shaped intensity profile, indicated by symbol 57, can be obtained.

Figure 4:
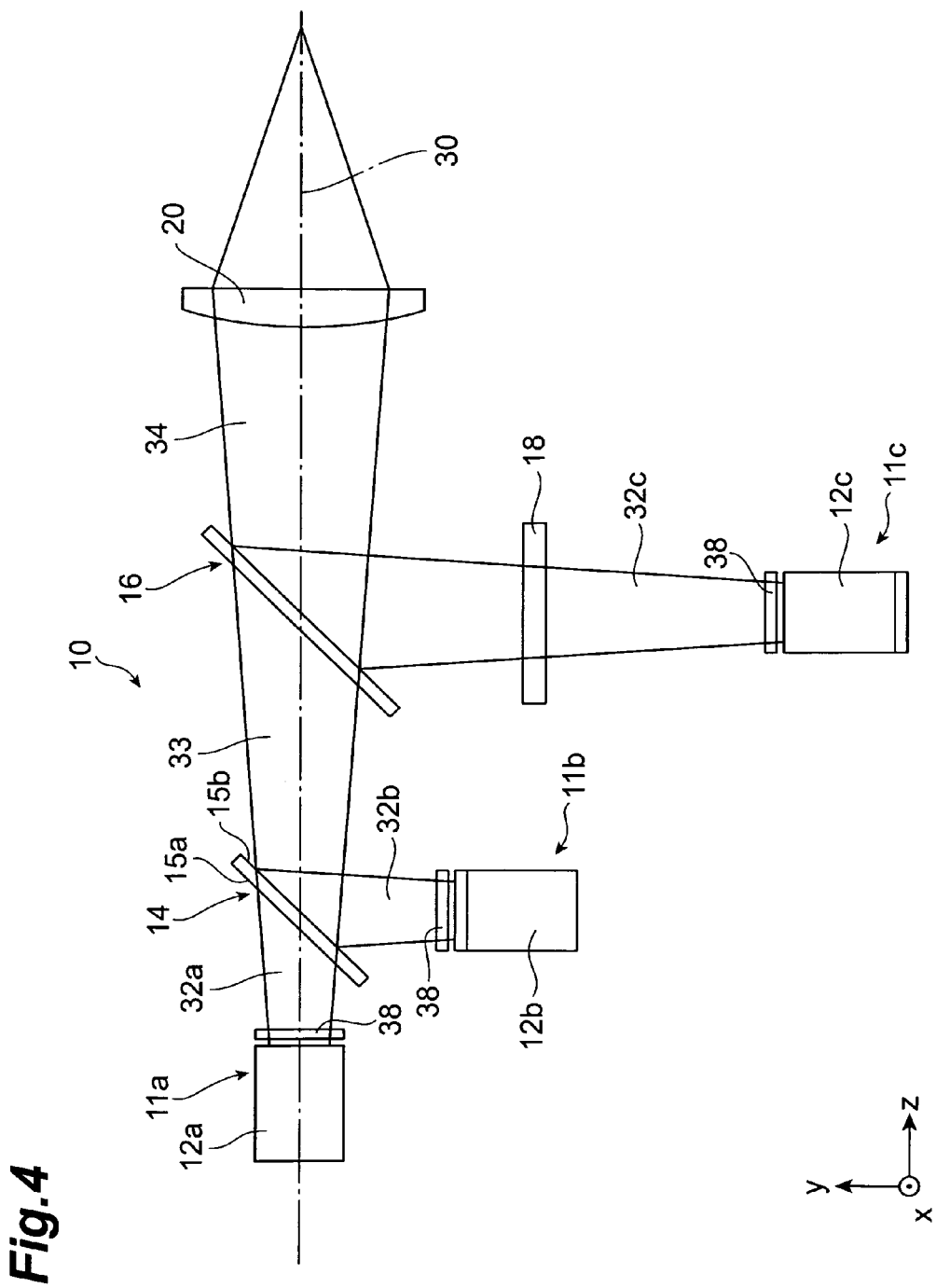
FIG. 4 is a schematic plan view of an arrangement of a laser apparatus according to a first embodiment.
Figure 5:
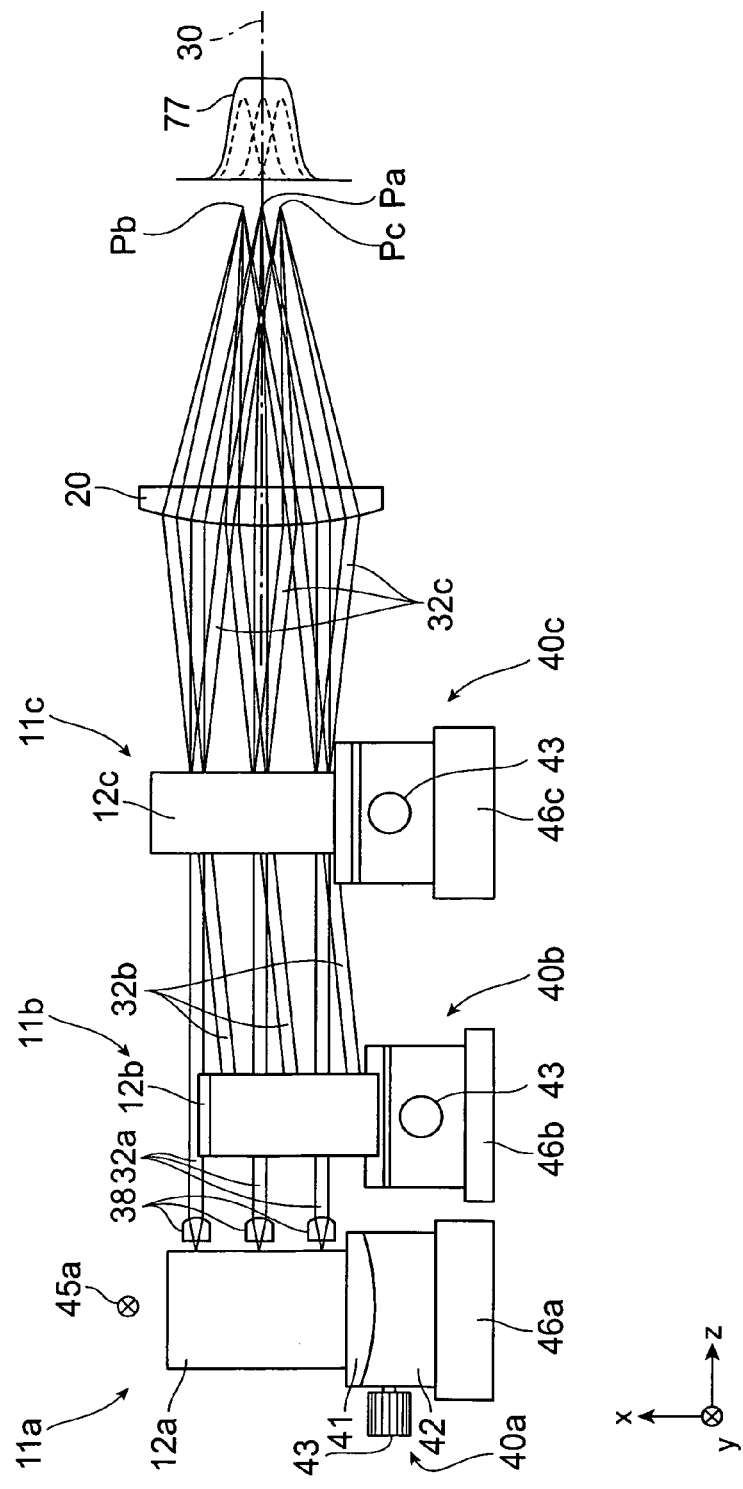
FIG. 5 is a schematic side view of the laser apparatus shown in FIG. 4.

An embodiment of a laser apparatus according to the present invention that is arranged according to the basic principles described above shall now be described. FIGS. 4 and 5 are schematic plan view and schematic side view of an arrangement of the laser apparatus 10, respectively, according to the embodiment. The laser apparatus 10 has a first light source 11a, a second light source 11b, and a third light source 11c. As shown in FIG. 5, these light sources 11a to 11c respectively output a plurality (three in the present embodiment) of laser beams 32a to 32c. The laser apparatus 10 furthermore has a slit mirror 14, a polarizing beam splitter 16, a half-wave plate 18, and a converging optical system 20, and synthesizes the laser beams 32a to 32c using these optical components. Symbol 30 in FIG. 4 indicates an optical axis of the converging optical system 20. For the sake of description, the slit mirror 14, the polarizing beam splitter 16, and the half-wave plate 18 are omitted in FIG. 5.

In order to facilitate comprehension of the following description, an orthogonal coordinate system, constituted of an x-axis, a y-axis, and a z-axis, is set up. The x-axis is parallel to a direction of lamination of semiconductor laser arrays (to be described below) in each light source, the z-axis is parallel to a direction of emission of light from the laser apparatus 10, and the y-axis is perpendicular to both the x-axis and z-axis.

Figure 6:
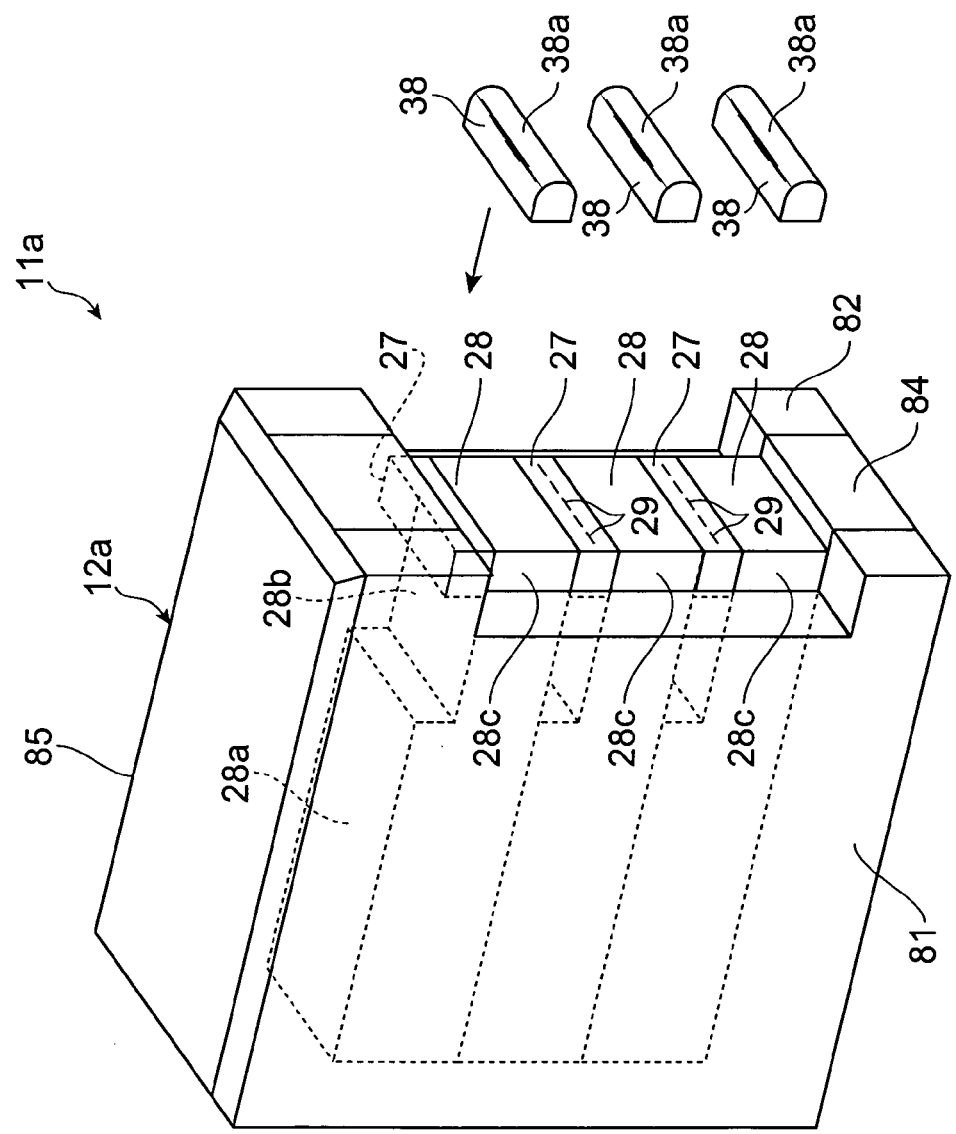
FIG. 6 is an exploded perspective view of an example of a light source.

FIG. 6 is an exploded perspective view of an example of the light source 11a. The light source 11a is constituted of a semiconductor laser array stack 12a and collimating lenses 38, and is positioned so as to emit light in the z-direction. The laser array stack 12a has a structure, in which a plurality (three in the present embodiment) of semiconductor laser arrays 27 and a plurality (three in the present embodiment) of heat sinks 28 are laminated alternately in the x-direction.

Each semiconductor laser array 27 is a laser element having a plurality of light emitting portions 29 aligned at equal intervals along the y-direction and is also called a laser diode array or a laser diode bar. Each light emitting portion 29 emits a laser beam along an axial direction (resonator direction) of the semiconductor laser array 27. With the light source 11a, the axial direction is parallel to the z-axis.

The laser beam emitted from each light emitting portion 29 has a fast axis and a slow axis. When a laser beam is emitted from a light emitting portion 29, the fast axis lies along a direction perpendicular to a pn junction surface of the semiconductor laser array 27, and the slow axis lies along a direction perpendicular to both the fast axis and the axial direction of the semiconductor laser array 27. The laser beam emitted from each light emitting portion 29 has a maximum spread angle in the fast axis direction and a minimum spread angle in the slow axis direction. With the light source 11a, the fast axis direction is parallel to the x-axis and the slow axis direction is parallel to the y-axis. The plurality of semiconductor laser arrays 27 are laminated so as to be matched in the fast axis direction and the slow axis direction. The plurality of light emitting portions 29 are aligned along the slow axis direction.

The laser beams emitted from the plurality of light emitting portions 29 of each semiconductor laser array 27 become mixed with each other in the slow axis direction, thereby forming a single laser beam 32a. A section (transverse section) perpendicular to an optical axis of the laser beam 32a has a shape (for example, an elliptical shape) that is elongate along the direction of alignment of the light emitting portions 29, that is, along the slow axis direction.

The heat sinks 28 are members for cooling the semiconductor laser arrays 27 and an example thereof is a water-cooled plate. Each heat sink 28 has a high portion 28a and a low portion 28b that form a stepped upper surface. Each semiconductor laser array 27 is mounted at a front end of the low portion 28b. In the description that follows, a portion 28c of the heat sink 28 on which a semiconductor laser array 27 is mounted shall be referred to as a "laser array mounting portion."

The respective side surfaces of the laminated structure formed by the semiconductor laser arrays 27 and the heat sinks 28 are covered by side covers 81 and 82. Also, an upper plate 83 and a bottom plate 84 of rectangular shapes are mounted above and below the laminated structure. An upper cover 85 is mounted on top of the side covers 81 and 82 and the upper plate 83. Normally, an electrode plate (not shown) that supplies a driving voltage to the semiconductor laser arrays 27 is mounted on a surface of the upper cover 85.

Although each laser beam 32a is small in spread in the slow axis direction, it has a comparatively large spread angle in the fast axis direction. In order to suppress the spread angle in the fast axis direction and increase the converging efficiency, the collimating lenses 38 are mounted in front of the laser array stack 12a. The laser beam 32a, emitted from each semiconductor laser array 27, is made parallel in the fast axis direction by each collimating lens 38, which is also called an FAC (fast axis collimator). In other words, each collimating lens 38 converts the corresponding laser beam 32a into a parallel beam within a plane perpendicular to the slow axis direction.

Depending on the design of a collimating means, a beam that has passed through the collimating means may not be made completely parallel in the strict sense and may have a slight angle of spread or angle of narrowing in accompaniment with the propagation of the beam. In the present Description, "parallel" shall refer to cases including that in which the beam has such a slight angle, that is, to cases where the beam is practically parallel.

The collimating lenses 38 can be fixed to the front of the laser array stack 12a by any method. For example, a light-transmitting cover (not shown) may be mounted onto the upper plate 83 and the bottom plate 84 so as to cover an exit surface of the laser array stack 12a, and the collimating lenses 38 may be fixed to this cover.

In the present embodiment, as each of the collimating lenses 38, a cylindrical lens having a lens surface 38a is used. The lens surface 38a is a cylindrical surface having a generating line parallel to the slow axis direction. These collimating lenses 38 are aligned at equal intervals along the fast axis direction and are in a one-to-one correspondence with the semiconductor laser arrays 27. Each collimating lens 38 is mounted in front of and close to an exit surface of the corresponding semiconductor laser array 27. As mentioned above, the laser beam 32a emitted from each semiconductor laser array 27 is collimated in the x-direction by the collimating lens 38. As a result, the first light source 11a outputs a set of laser beams 32a that are aligned in parallel along the x-direction as shown in FIG. 4. These laser beams 32a have mutually parallel optical axes and mutually parallel slow axis directions.

The second and third light sources 11b and 11c have the same structure as the first light source 11a. The laser beams 32b emitted from the light source 11b thus have mutually parallel optical axes and mutually parallel slow axis directions. Also, the laser beams 32c emitted from the light source 11c have mutually parallel optical axes and mutually parallel slow axis directions. However the orientations of the light sources 11b and 11c differ from that of the light source 11a. This point shall now be described in detail.

As shown in FIG. 5, the light sources 11a to 11c are mounted on goniometer stages 40a to 40c, respectively, and these goniometer stages 40a to 40c are mounted on support bases 46a to 46c, respectively. These support bases may be moving stages that can move in parallel along any one or more of the x-axis, y-axis, and z-axis. For the sake of illustration, the illustration of the goniometer stages and the support bases are omitted in FIG. 4.

The goniometer stages 40a to 40c are devices for adjusting the orientations of the light sources 11a to 11c. Each goniometer stage has a pedestal 41, a main body 42, and an adjusting knob 43. An upper surface of the pedestal 41 is called a stage surface and each of the light sources 11a to 11c are mounted thereon. The pedestal 41 can be rotated relative to the main body 42 about a rotation axis 45a, 45b, or 45c positioned at an upper portion of the goniometer stage. The rotation angle can be adjusted by turning the adjusting knob 43.

The goniometer stages 40a to 40c can change elevation angles of the light sources 11a to 11c. As shown in FIG. 5, the goniometer stage 40a has the rotation axis 45a that is parallel to the y-axis, and the pedestal 41 can be rotated about the rotation axis 45a. In the present embodiment, the rotation angle of the goniometer stage 40a is set to 0 degrees and thus the first light source 11a is positioned parallel to a horizontal plane, that is, the yz-plane. The elevation angle of the light source 11a is thus 0°.

Figure 7:
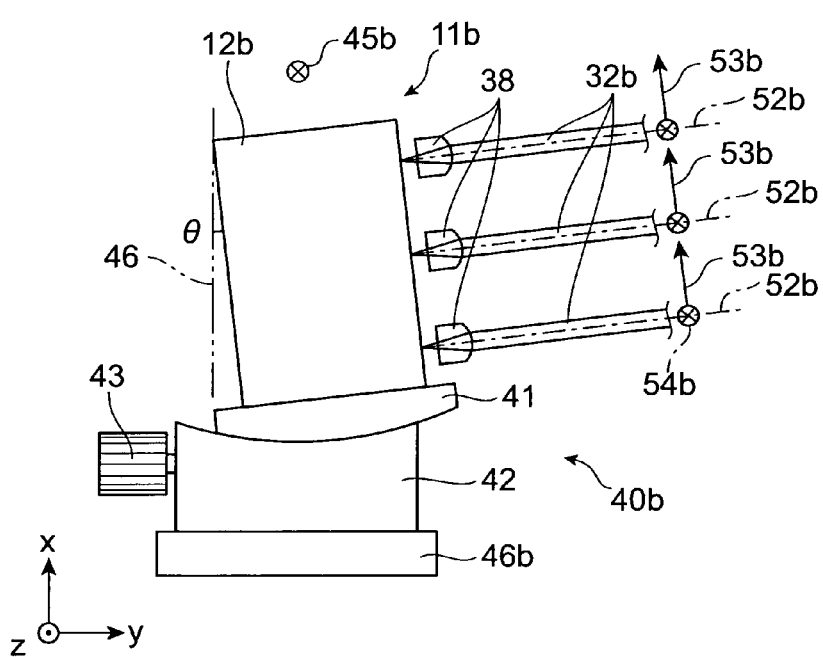
FIGS. 7(a)-(b) show schematic side views of adjustment of elevation angles of light sources using goniometer stages.
Figure 7:
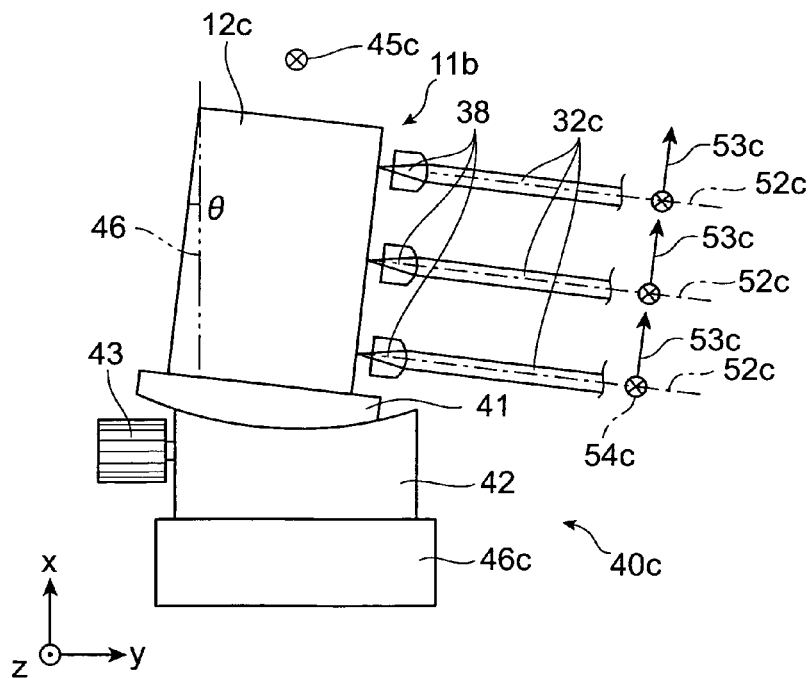

FIG. 7 shows schematic side views of adjustment of an elevation angle of a light source using a goniometer stage. The goniometer stages 40b and 40c respectively have rotation axes 45b and 45c that are parallel to the z-axis, and the pedestals 41 can be rotated about these rotation axes.

As shown in FIG. 7(a), the pedestal 41 of the goniometer stage 40b is set at a position that is rotated counterclockwise about the rotation axis 45b by an angle θ from a horizontal position 46. If an angle, by which the exit surface of the laser array stack 12b is inclined upward with respect to the horizontal plane (yz-plane), is designated as being positive, and an angle, by which the exit surface is inclined downward, is designated as being negative, the elevation angle of the light source 11b is +θ. Optical axes 52b and fast axes 53b of the laser beams 32b emitted from the light source 11b are thus inclined at an angle of +θ with respect to the y-axis and the x-axis, respectively. θ is an acute angle (an angle greater than 0° and less than 90°). Slow axes 54b of the laser beams 32b are parallel to the z-axis.

As shown in FIG. 7(b), the pedestal 41 of the goniometer stage 40c is set at a position that is rotated clockwise about the rotation axis 45c by an angle θ from the horizontal position 46. That is, the elevation angle of the light source 11c is −θ. Optical axes 52c and fast axes 53c of the laser beams 32c emitted from the light source 11b are thus inclined at an angle of −θ with respect to the y-axis and the x-axis, respectively. Slow axes 54c of the laser beams 32c are parallel to the z-axis.

Figure 8:
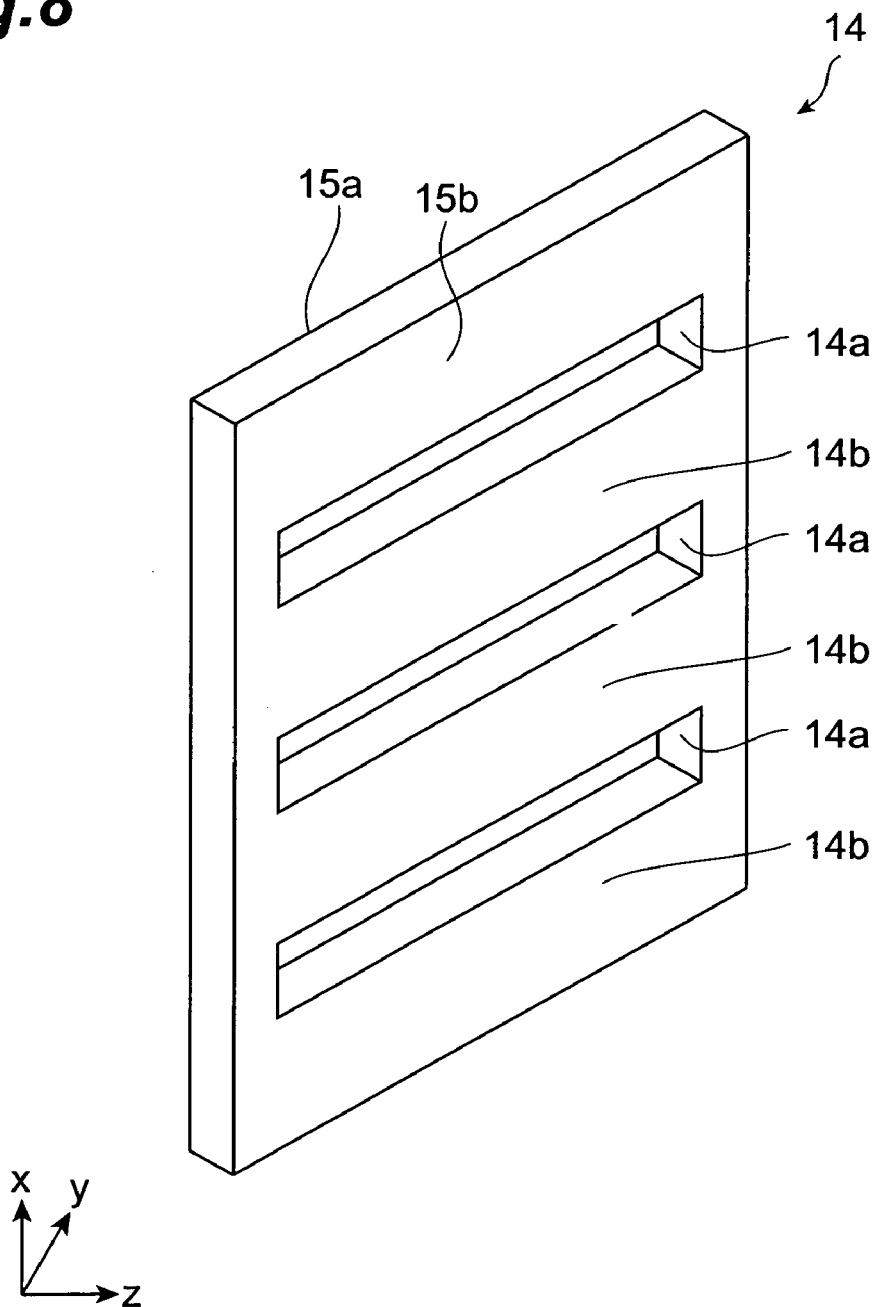
FIG. 8 is a perspective view of a slit mirror.

FIG. 8 is a perspective view of the slit mirror 14. The slit mirror 14 is a light reflector with a rectangular, plate-like shape and has three rectangular slits 14a formed therein at equal intervals along the x-direction. These slits 14a have mutually equal dimensions and shapes and pass through the slit mirror 14 along the thickness direction. The intervals of the slits 14a are equal to the intervals at which the semiconductor laser arrays 27 are laminated in the first light source 11a. These slits 14a are in a one-to-one correspondence with the three beams 32a, emitted from the light source 11a, and respectively transmit the beams 32a.

The slit mirror 14 is positioned so as to be parallel to the x-axis and form angles of 45° with respect to the y-axis and the z-axis. The slit mirror 14 has two principal surfaces 15a and 15b that oppose each other, with the principal surface 15a facing the first light source 11a and the principal surface 15b facing the second light source 11b. The principal surface 15b has three rectangular reflecting portions 14b that are positioned alternately with respect to the slits 14a along the x-axis direction. These reflecting portions 14b are positioned at equal intervals, and the intervals are equal to the intervals at which the semiconductor laser arrays 27 are laminated in the second light source 11b. The reflecting portions 14b are in a one-to-one correspondence with the three laser beams 32b, emitted from the light source 11b, and reflect the laser beams 32b at an adequately high reflectance. This reflectance is preferably no less than 90%.

The slit mirror 14 synthesizes the laser beams 32a from the first light source 11a with the laser beams 32b from the second light source 11b. Each laser beam 32a emitted from the first light source 11a passes through the corresponding slit 14a and propagates in the +z-direction. Meanwhile, each laser beam 32b emitted from the second light source 11b propagates in a direction inclined by an angle of +θ with respect to the +y-direction in a plane perpendicular to the z-axis and becomes incident on the corresponding reflecting portion 14b. As shown in FIG. 4, the reflecting portions 14b reflect the laser beams 32b in the +z-direction within planes perpendicular to the x-axis. A set of beams, that is, a synthesized beam 33, formed of the laser beams 32a and 32b, is thereby generated. The laser beams 32a and 32b can thus be synthesized readily using the slit mirror 14.

Each of the laser beams 32b reflected by the slit mirror 14 has an optical axis that is inclined counterclockwise by θ from the +z-direction about a rotation axis parallel to the y-axis, has a fast axis that is inclined counterclockwise by θ from the +x-direction about the rotation axis parallel to the y-axis, and has a slow axis parallel to the y-axis.

The slit mirror 14 thus deflects the laser beams 32b within planes perpendicular to the fast axis direction of the laser beams 32a and makes the laser beams 32a and 32b overlap within these planes. The reflecting portions 14b reflect the laser beams 32b in a direction inclined upward by θ from the +z-direction within a plane perpendicular to the y-axis. The reflected laser beams 32b thus have optical axes that are inclined upward by the angle θ with respect to the optical axes of the laser beams 32a. However, because θ is adequately small, the synthesized beam 33 propagates substantially in the +z-direction.

From the slit mirror 14, the synthesized beam 33 is made incident onto the polarizing beam splitter 16. The polarizing beam splitter 16 transmits linearly polarized light that is polarized in a direction parallel to the y-axis and reflects linearly polarized light that is polarized in a direction parallel to the x-axis. By using such properties of the polarizing beam splitter 16, the laser apparatus 10 synthesizes the laser beams 32c, emitted from the third light source 11c, with the synthesized beam 33.

In general, most of the light emitted from a semiconductor laser element is p-polarized light and has a polarization direction parallel to the slow axis direction. The polarization directions of the laser beams 32a emitted from the first light source 11a are thus parallel to the y-axis. Also, the polarization directions of the laser beams 32b emitted from the second light source 11b are parallel to the z-axis. When the laser beams 32b are reflected by the slit mirror 14, the polarization directions of the laser beams 32b become parallel to the y-axis. The synthesized beam 33 thus practically has only components that are polarized in the y-direction. The synthesized beam 33 is thus transmitted through the beam splitter 16.

Meanwhile, the laser beams 32c from the third light source 11c are converted from p-polarized light into s-polarized light by the half-wave plate 18. The half-wave plate 18 is a polarization conversion element that rotates the polarization direction of linearly polarized light, made incident thereon, by 90°. The half-wave plate 18 is disposed between the third light source 11c and the polarizing beam splitter 16. The laser beams 32c emitted from the light source 11c are p-polarized light and have polarization directions parallel to the slow axes 54c of the laser beams 32c. From the light source 11c, the laser beams 32c are made incident on and are transmitted through the half-wave plate 18. In this process, the half-wave plate 18 rotates the polarization directions of the laser beams 32c by 90°. As a result, the polarization directions of the laser light 32c become parallel to the fast axes 53c. The laser beams 32c are thereafter made incident on the polarizing beam splitter 16.

Because as shown in FIG. 7(b), the fast axes 53c of the laser beams 32c are inclined with respect to the x-axis, the laser beams 32c that are made incident on the polarizing beam splitter 16 include both components that are polarized parallel to the y-axis and components that are polarized parallel to the x-axis. Because the inclination angle θ of the slow axes 54c with respect to the x-axis is adequately small, a large portion of each laser beam 32c is polarized parallel to the x-axis. The polarizing beam splitter 16 thus reflects a large portion of each laser beam 32c.

The laser beams 32c propagate in a direction inclined downward by θ from the +y-direction within a plane perpendicular to the z-axis and are made incident on the polarizing beam splitter 16. As shown in FIG. 4, the polarizing beam splitter 16 reflects the laser beams 32c toward the +z-direction in planes perpendicular to the x-axis. The laser beams 32c are thereby synthesized with the synthesized beam 33 within the planes perpendicular to the x-axis, and a synthesized beam 34, formed of the laser beams 32a, 32b, and 32c, is thereby generated. The laser beams 32a, 32b, and 32c can thus be synthesized easily using the polarizing beam splitter 16.

Each of the laser beams 32c reflected by the polarizing beam splitter 16 has an optical axis that is inclined clockwise by θ from the +z-direction about a rotation axis parallel to the y-axis, has a fast axis that is inclined clockwise by θ from the +x-direction about the rotation axis parallel to the y-axis, and has a slow axis parallel to the y-axis.

The polarizing beam splitter 16 thus deflects the laser beams 32c within planes perpendicular to the fast axis direction of the laser beams 32a and makes the laser beams 32a, 32b, and 32c overlap within these planes. As shown in FIG. 5, the polarizing beam splitter 16 reflects the laser beams 32c in a direction inclined downward by θ from the +z-direction within a plane perpendicular to the y-axis. However, because the angle θ is adequately small, the synthesized beam 34 propagates substantially along the +z-direction and is made incident on the converging optical system 20.

The converging optical system 20 is constituted, for example, of a single lens or a plurality of lenses. As shown in FIG. 4, in a plane perpendicular to the x-axis, the converging optical system 20 converges the laser beams 32a to 32c in the synthesized beam 34 onto the same position. Also as shown in FIG. 5, in a plane perpendicular to the y-axis, the converging optical system 20 converges the laser beams 32a to 32c respectively onto a plurality of positions Pa to Pc. As with the example shown in FIG. 3, the convergence positions Pa to Pc are positioned on a focal plane of the converging optical system 20. The convergence positions Pa to Pc are mutually separated at equal intervals along a direction, which is perpendicular to both the slow axis directions of the laser beams 32a to 32c and an optical axis 30 of the converging optical system 20, that is, along the x-direction. The intensity profiles of the converged laser beams 32a to 32c overlap while being mutually shifted along the x-direction. Consequently, the synthesized beam 34 has an intensity profile 77 with a top hat shape having a flat upper portion.

Because the plurality of laser beams emitted from the semiconductor laser arrays are thus converged upon being shifted in a direction perpendicular to the respective slow axis directions, the intensity profiles of the laser beams can be overlapped partially along this direction. A top hat shaped intensity profile can thereby be formed in the direction perpendicular to the slow axis directions of the laser beams. As shall be described below, by using the overlapped laser beams to perform laser processing, such as laser welding, processing faults due to dimensional errors of workpieces and deviations of beam illumination positions in the direction perpendicular to the slow axis directions become unlikely to occur.

The distance between adjacent convergence positions depend on the angle θ between the optical axes of the laser beams 32a to 32c. Though depending on the rear focal length of the converging optical system 20 and the shapes of the intensity profiles of the laser beams 32a to 32c, the value of θ suited for forming the top hat shaped intensity profile 77 is normally $0°<θ≦2°$ and more preferably $0°<θ≦1°$.

Figure 9:
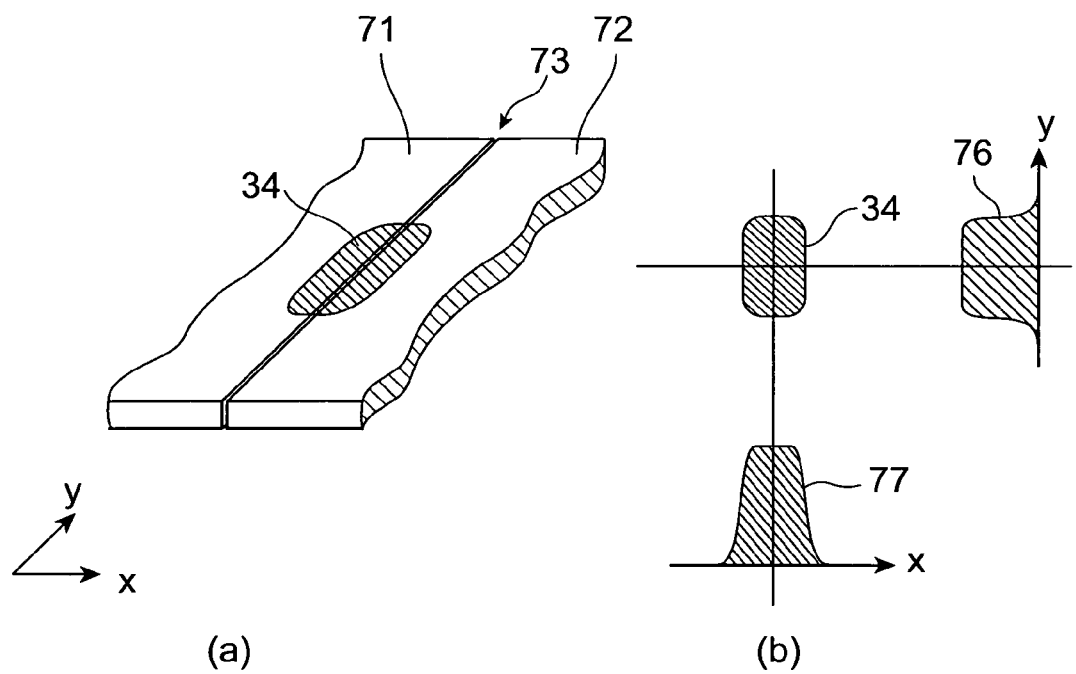
FIGS. 9(a)-(b) show schematic views of a manner of performing laser welding using a synthesized beam.

Merits of the present embodiment shall now be described with reference to FIG. 9. FIG. 9 shows a manner of laser welding using the synthesized beam 34 and intensity profiles of the synthesized beam 34 on the focal plane of the converging optical system 20. As shown in FIG. 9(a), laser welding is performed by illuminating the synthesized beam 34 onto a butted region 73 of steel plates 71 and 72. The transverse section of the synthesized beam 34 is elongate in the slow axis directions (y-direction) of the laser beams 32a to 32c in the synthesized beam 34. The synthesized beam 34 is illuminated so that the longitudinal direction of its transverse section matches the longitudinal direction of the butted region 73.

As shown in FIG. 9(b), the synthesized beam 34 has a top hat shaped intensity profile 76 in the slow axis directions. Thus in laser welding the steel plates together, by matching the slow axis direction (longitudinal direction of the beam transverse section) of the synthesized beam 34 with the longitudinal direction of the butted region 73 and scanning the synthesized beam 34 in the slow axis direction, welding can be performed while performing preheating and slow cooling. Thermal strain can thereby be suppressed to obtain a high processing quality.

The synthesized beam 34 furthermore has the top hat shaped intensity profile 77 in a direction (x-direction) perpendicular to the slow axis directions. The ratio of the half-value width and the width at a base portion (for example, the $1/e^2$ width) of the intensity profile 77 is closer to 1 in comparison to the same ratio of the Gaussian profile 76. This ratio, that is, the ($1/e^2$ width)/half-value width of the intensity profile 77 is preferably no less than 1 and no more than 2 and more preferably no less than 1 and no more than 1.5.

Because the intensity profile 77 has a top hat shape, when steel plates are laser welded, the synthesized beam 34 has a large allowance in regard to the gap between steel plates and the deviation of the beam illumination position. That is, a processing fault is unlikely to occur even if a non-uniform gap is present between the steel plates or the illumination position of the synthesized beam 34 is deviated along the x-direction from an optimal position. The laser beam 34 can thus be used favorably in laser welding and other forms of laser processing.

Also with the present embodiment, the orientations of the laser array stacks 12b and 12c can be adjusted using the goniometer stages 40b and 40c. The distances among the convergence positions Pa to Pc can thus be set appropriately and the intensity profiles of the synthesized beam 34 can be optimized.

Second Embodiment

A laser apparatus according to a second embodiment of the present invention shall now be described. In the first embodiment, by adjusting the orientations of the light sources 11b and 12c using the goniometer stages 40b and 40c, the optical axes of the laser beams 32a to 32c exiting from the beam synthesizing means (the slit mirror 14 and the polarizing beam splitter 16) are inclined with respect to each other. However, with the laser apparatus according to the present invention, the optical axes of a plurality of laser beams may be inclined with respect to each other by other means.

Figure 10:
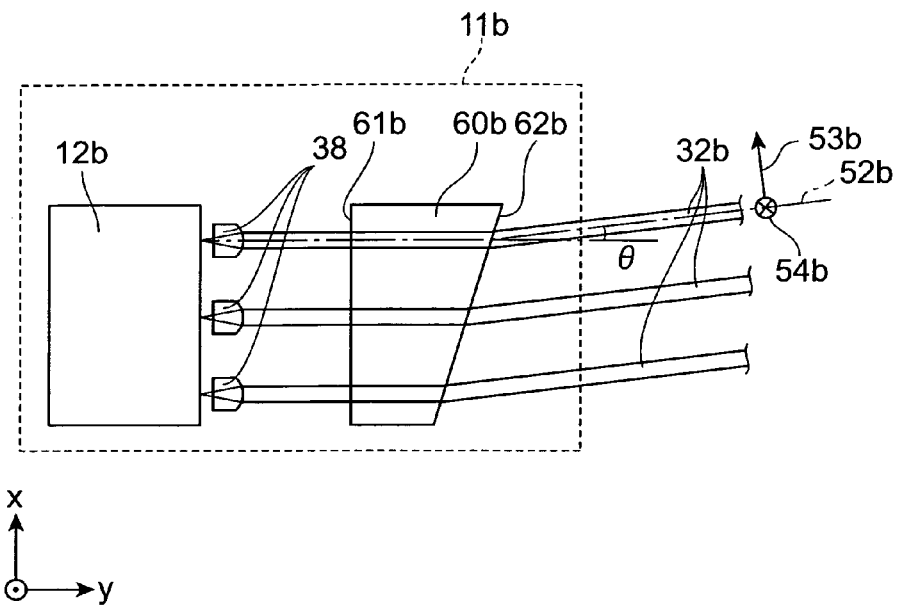
FIGS. 10(a)-(b) show schematic side views of light sources in a second embodiment.
Figure 10:
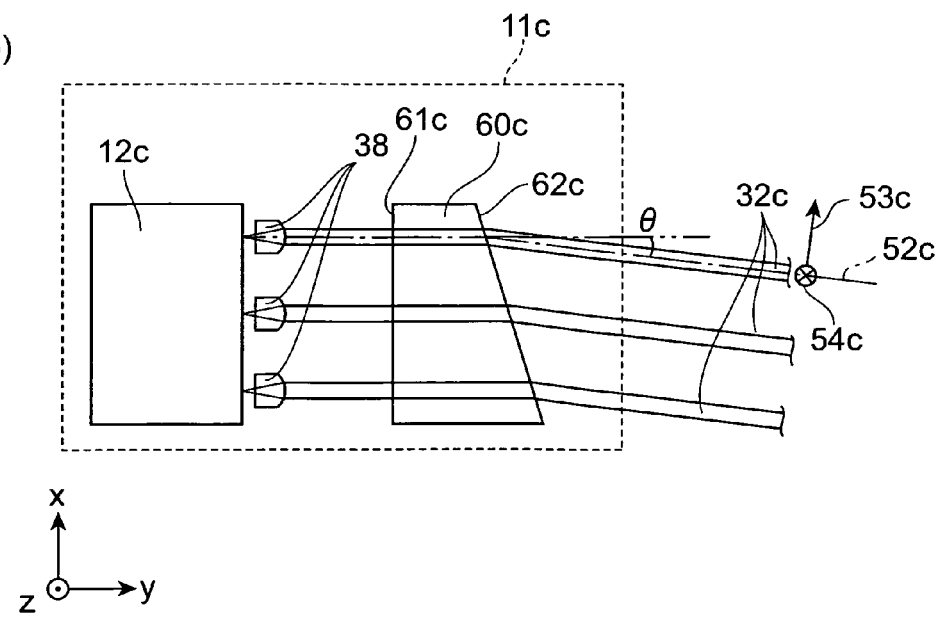

FIG. 10 is a schematic side view of a means that inclines optical axes of laser beams with respect to each other in the present embodiment. In the present embodiment, the goniometer stages 40a to 40c and the support bases 46a to 46c are removed from the light sources 11a to 11c. Wedge prisms 60b and 60c are mounted in front of the collimating lenses 38 in the light sources 11b and 11c.

The wedge prism 60b has an incidence surface 61b that faces the laser array stack 12b across the collimator lenses 38 and an exit surface 62b, positioned at the opposite side of the incidence surface 61b. The exit surface 62b is inclined so as to form a predetermined acute angle in a counterclockwise direction from a plane perpendicular to the x-axis. Likewise, the wedge prism 60c has an incidence surface 61c that faces the laser array stack 12c across the collimator lenses 38 and an exit surface 62c, positioned at the opposite side of the incidence surface 61c. The exit surface 62c is inclined so as to form a predetermined obtuse angle in a counterclockwise direction from a plane perpendicular to the x-axis.

In the light source 11b, the laser array stack 12b is positioned horizontal to the yz-plane and emits laser beams 32b with optical axes parallel to the y-direction. With each laser beam 32b, the slow axis direction is parallel to the z-direction and the fast axis direction is parallel to the x-direction. Of the laser beams 32b, components perpendicular to the slow axis direction are made parallel by the collimator lenses 38. The wedge prism 60b refracts the laser beams 32b, which have been made parallel, within a plane perpendicular to the slow axis direction. The optical axes 52b and the fast axes 52b of the laser beams 32b are thereby inclined at an angle of +θ with respect to the y-axis and the x-axis. Here, an angle, by which an optical axis of a laser beam 32b is inclined upward with respect to a plane perpendicular to the x-axis, is designated as being positive, and an angle, by which the optical axis is inclined downward, is designated as being negative, and θ is an acute angle. Meanwhile, the slow axis 54b remains parallel to the z-axis.

The laser array stack 12c is likewise positioned horizontal to the yz-plane and emits laser beams 32c with optical axes parallel to the y-direction. With each laser beam 32c, the slow axis direction is parallel to the z-direction and the fast axis direction is parallel to the x-direction. Of the laser beams 32c, components perpendicular to the slow axis direction are made parallel by the collimator lenses 38. The wedge prism 60c refracts the laser beams 32c, which have been made parallel by the collimator lenses 38, within a plane perpendicular to the slow axis direction. The optical axes 52c and the fast axes 53c are thereby inclined at an angle of −θ with respect to the y-axis and the x-axis. Meanwhile, the slow axis 54b remains parallel to the z-axis.

By use of the wedge prisms 60b and 60c, the laser beams 32b and 32c, with optical axes that extend in the same directions as in the first embodiment, are made incident on the slit mirror 14 and the polarizing beam splitter 16. The laser beams 32a to 32c that propagate from the polarizing beam splitter 16 to the converging optical system 20 thus have optical axes that are inclined with respect to each other. Consequently, the synthesized beam 34, having a top hat shaped intensity profile in a direction perpendicular to the slow axis directions of the laser beams 32a to 32c, can be formed with a comparatively simple arrangement.

The present invention has been described in detail based on the embodiments above. However, the present invention is not restricted to the above embodiments. The present invention can be modified variously within a scope that does not deviate from the gist thereof.

With each of the above-described embodiments, the optical axes of laser beams emitted from three light sources are inclined with respect to each other so that the planes, containing the optical axis and slow axis directions of the laser beams, are mutually non-parallel. However, in a case where planes, containing the optical axis and slow axis directions of laser beams emitted from a plurality of light sources, are mutually parallel, optical axes of a portion of the laser beams can be inclined with respect to optical axes of other laser beams when a means that synthesizes these beams deflects this portion of the laser beams.

With each of the above-described embodiments, as a means for synthesizing the plurality of laser beams, the slit mirror 14 and the polarizing beam splitter 16, which transmit a portion of the plurality of laser beams and reflect the remaining portion, are used. However, the beam synthesizing means may instead synthesize first and second laser beams that are made incident from different directions by reflecting both beams.

As is clear from the above description of the present invention, embodiments according to the present invention may be modified in various ways. Such modifications do not fall outside the scope of the present invention and as is obvious to those skilled in the art, all such modifications are intended to be included within the scope of the Claims that follow.

INDUSTRIAL APPLICABILITY

The laser apparatus according to the present invention can synthesize laser beams from a plurality of semiconductor laser arrays to form a synthesized beam having a top hat shaped intensity profile in a direction perpendicular to the slow axis directions of the laser beams. By performing laser processing using this synthesized beam, processing faults are made unlikely to occur even if dimensional errors of a workpiece or deviations of the beam illumination positions occur in a direction perpendicular to the slow axis directions.

The invention claimed is:

1. A laser apparatus comprising:
a first light source, including a first laser array stack, in which a plurality of first semiconductor laser arrays, each emitting a first laser beam, are laminated;
a second light source, including a second laser array stack, in which a plurality of second semiconductor laser arrays, each emitting a second laser beam, are laminated;
a beam synthesizer, deflecting at least one of the first and second laser beams and generating a synthesized beam formed of the first and second laser beams; and
a converger, converging the synthesized beam; wherein
the first laser beams exiting from the beam synthesizer have mutually parallel optical axes and mutually parallel slow axis directions, wherein
the second laser beams exiting from the beam synthesizer have optical axes that are mutually parallel and inclined with respect to the optical axes of the first laser beams and slow axes directions that are parallel to the slow axes directions of the first laser beams,
the converger converges the first laser beams onto a first convergence position within a plane perpendicular to the slow axis directions and converges the second laser beams onto a second convergence position within the plane perpendicular to the slow axis directions, and
the second convergence position is separated from the first convergence position by a predetermined distance along a direction perpendicular to both an optical axis of the converger and the slow axis directions.

2. The laser apparatus according to claim 1, wherein the predetermined distance is set so that intensity profiles of the first and second laser beams that are respectively converged onto the first and second convergence positions overlap partially within the plane perpendicular to the slow axis directions.

3. The laser apparatus according to claim 1, further comprising: a device that adjusts an orientation of the second laser array stack so as to rotate the optical axes of the second laser beams about rotation axes parallel to the slow axis directions of the second laser beams.

4. The laser apparatus according to claim 1, wherein
the second light source further includes a beam refractor that receives the second laser beams from the second laser array stack, and
the beam refractor refracts the second laser beams so as to make the second laser beams, contained in the synthesized beam, have optical axes that are inclined with respect to the optical axes of the first laser beams.

5. The laser apparatus according to claim 1, wherein
the beam synthesizer has a transmitting portion that transmits the first laser beams and a reflecting portion that reflects the second laser beams so that the slow axis directions of the first and second laser beams are made mutually parallel.

* * * * *